United States Patent
Tomomatsu et al.

(10) Patent No.: US 8,754,495 B1
(45) Date of Patent: Jun. 17, 2014

(54) PHOTODETECTOR ARRAY HAVING DIFFERENT PHOTODIODE STRUCTURES

(71) Applicant: Texas Instruments Incorporated, Dallas, TX (US)

(72) Inventors: Hiroyuki Tomomatsu, Beppu (JP); Motoaki Kusamaki, Beppu (JP); Kohichi Kubota, Beppu (JP); Yuta Masuda, Oita-Pref (JP); Akihiro Sugihara, Beppu (JP); Hiroshi Sera Kitada, Tokyo (JP); Takeshi Konno, Ushiku (JP)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 13/871,713

(22) Filed: Apr. 26, 2013

(51) Int. Cl.
*H01L 31/0232* (2014.01)
*H01L 31/042* (2014.01)
*H01L 27/144* (2006.01)
*H01L 27/146* (2006.01)
*G11B 7/131* (2012.01)
*G11B 7/00* (2006.01)

(52) U.S. Cl.
CPC ........ *H01L 31/02327* (2013.01); *H01L 31/042* (2013.01); *H01L 27/1446* (2013.01); *H01L 27/14643* (2013.01); *G11B 7/131* (2013.01); *G11B 2007/0006* (2013.01)
USPC .......... 257/437; 257/440; 257/443; 257/458; 438/69; 438/80

(58) Field of Classification Search
CPC ............ H01L 31/02327; H01L 31/042; H01L 27/1446; H01L 27/14643; G11B 7/131; G11B 2007/0006
USPC ............... 257/437, 440, 443, 458; 438/69, 80
See application file for complete search history.

(56) References Cited

U.S. PATENT DOCUMENTS 7,332,751 B2 * 2/2008 Iguchi ........................... 257/184
2008/0205820 A1 8/2008 Zheng et al.

* cited by examiner

*Primary Examiner* — Tu-Tu Ho
(74) *Attorney, Agent, or Firm* — Jacqueline J. Garner; Wade J. Brady, III; Frederick J. Telecky, Jr.

(57) ABSTRACT

A method of fabricating a photodiode array having different photodiode structures includes providing a semiconductor substrate having first and second diode areas including a bottom substrate portion doped with a first doping type, an intrinsic layer, and a top silicon layer doped with a second doping type. The second diode areas are implanted with the second doping type. A dopant concentration in the surface of the second diode areas is at least three times higher than in the first diode areas. The top silicon layer is thermally oxidized to form a thermal silicon oxide layer to provide a bottom Anti-Reflective Coating (ARC) layer. The second diode areas grow thermal silicon oxide thicker as compared to the first diode areas. A top ARC layer is deposited on the bottom ARC layer. First PDs are provided in the first diode areas and second PDs provided in the second diode areas.

16 Claims, 5 Drawing Sheets

PHOTODETECTOR ARRAY HAVING DIFFERENT PHOTODIODE STRUCTURES

FIELD

Disclosed embodiments relate to photodetector arrays and photodetector integrated circuits (ICs) including photodiode arrays, and methods of making the same.

BACKGROUND

A photodetector IC (PDIC) includes an array of discrete photodiodes (a photodiode array or "PDA") on a common substrate material, typically a silicon chip, amplifiers, and readout circuitry. Electromagnetic radiation received by the photodiodes generates electron-hole pairs, and the electrons migrate to the nearest junction, typically a PIN junction or a NIP junction. A PIN or NIP junction is a diode with a wide, lightly doped near-intrinsic semiconductor region (I) between a p-type semiconductor and an n-type semiconductor region which are both typically heavily doped as they are used for ohmic contacts. The light doping level in the intrinsic region results in low junction capacitance for both junctions. After a fixed integration time the charge accumulated at each PD element is sequentially read with readout circuitry to generate the electrical response of the PDIC.

Some PDICs are used for processing CD, DVD and Blu-ray formats as part of an optical pick-up apparatus, where CD, DVD and Blu-ray each operate at different wavelengths (bands). A typical optical pick-up apparatus enables information to be recorded, reproduced and erased with respect to a CD group disc (e.g. CD, CD-ROM, CD-R and CD-RW), a DVD group disc (e.g. DVD, DVD-ROM, DVD-RAM, DVD-R and DVD-RW, DVD+R, DVD+RW), and Blu-ray format discs, with single or multiple layer formats. The typical optical pick-up apparatus has an infrared semiconductor laser device for the CD (at about 780 nm), a red semiconductor laser device for the DVD (at about 650 nm) and a blue laser device for the Blu-ray (at about 405 nm). During operation of the optical pick-up apparatus a portion of the light from the respective lasers and a portion of the light from the respective group discs is directed by a beam splitter to the PDs of the PDA.

Generally, the process used to form PDAs forms a single Anti-Reflective Coating (ARC) having a particular ARC film structure (materials and/or thicknesses) designed so that one of the bands (CD, DVD or Blu-ray) is processed at a high sensitivity. Sensitivity for a photodiode is generally defined as the ratio of its output current to incident light power (e.g., in amps/watt (A/W)). For example, the ARC stack for the photodiodes may be designed so that the Blu-ray band (405 nm radiation) may have nearly its highest possible sensitivity.

SUMMARY

Disclosed embodiments recognize the conventional Anti-Reflective Coating (ARC) stack design choice for all the photodiodes (PDs) in the photodiode array (PDA) which involves a design so that one band (e.g., the Bier-ray band (for 405 nm radiation)) has nearly its highest possible sensitivity, results in the sensitivity of the PDs processing the other bands (e.g., DVD and CD bands (650 nm and 780 nm radiation, respectively)) being generally significantly lower as compared to their highest possible sensitivity. Disclosed embodiments describe processing steps and resulting PDA structures having first PDs in first diode areas having a first ARC stack and second PDs in second diode areas having a second ARC film stack which is different from the first ARC film stack. For CD, DVD and Blu-ray applications, disclosed PDA designs make possible independently designing the Blu-ray PDs, and DVD and CD's PDs to eliminate the conventional requirement to sacrifice the sensitivity for one or more bands (e.g., DVD and CD) to obtain newly the highest possible sensitivity in a selected band (e.g., Blu-ray).

Disclosed PDAs provide PDs having at least two different photodiode structures, and have a multi-layer (e.g., a double-layer, or optionally a triple layer) ARC film structure including a top ARC layer and a bottom ARC layer, with the lower ARC layer being thermal silicon oxide that includes thicker regions and thinner regions across the top silicon comprising surface layer. Disclosed methods benefit from differential doping of the top silicon comprising surface of at least three times (e/.g., ≥an order of magnitude (10×) difference) in surface doping concentration in the final device, which enables the thermal oxidation rate over the PDs and thus the ARC film stack in the first diode areas (with PDs referred to therein as first PDs) to be different (e.g., lower) as compared to the thermal oxidation rate over the PDs and thus the ARC film stack in the second diode areas (with the other PDs referred to therein as second PDs). Applied to PDICs for processing Blu-ray, DVD and CD, each DVD and CD PDs can have a lower surface doping concentration (and thus thinner thermal silicon oxide in their ARC stacks) as compared to the doping concentration for the Blu-ray PDs (and thus thicker thermal silicon oxide in their ARC stacks).

BRIEF DESCRIPTION OF THE DRAWINGS

Reference will now be made to the accompanying drawings, which are not necessarily drawn to scale, wherein.

DETAILED DESCRIPTION

Figure 1:
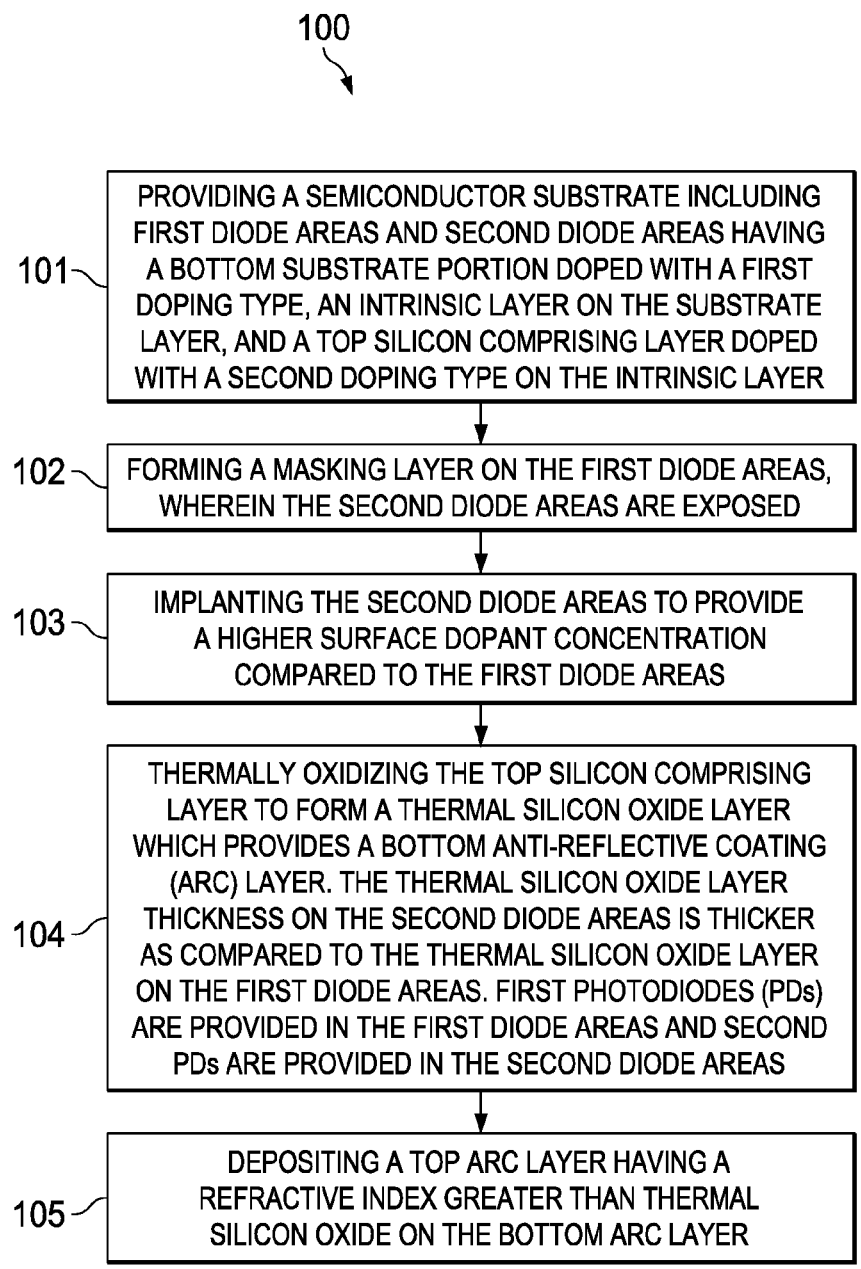
FIG. 1 is a flow chart that shows steps in an example method for fabricating a PDA having first PDs in first diode areas having a first ARC stack and second PDs in second diode areas having a second ARC film stack which is different from the first ARC film stack, according to an example embodiment.

Example embodiments are described with reference to the drawings, wherein like reference numerals are used to designate similar or equivalent elements. Illustrated ordering of acts or events should not be considered as limiting, as some acts or events may occur in different order and/or concurrently with other acts or events. Furthermore, some illustrated acts or events may not be required to implement a methodology in accordance with this disclosure.

FIG. 1 is a flow chart that shows steps in an example method 100 for fabricating a PDA having first PDs in first diode areas having a first ARC stack and second PDs in second diode areas having a second ARC film stack which is different from the first ARC film stack, according to an example embodiment. Step 101 comprises providing a semiconductor substrate (e.g., a semiconductor wafer) including first diode areas and second diode areas having a bottom substrate portion doped with a first doping type, an intrinsic layer on the substrate layer, and a top silicon comprising layer doped with a second doping type on the intrinsic layer. The bottom substrate portion provides a bottom diode layer and the top silicon comprising layer provides a top diode layer. As used herein, an "intrinsic layer" is defined as a silicon comprising layer having a doping level $\leq 1\times10^{16}$ cm$^{-3}$, typically being around $10^{13}$ cm$^{-3}$ ($10^{13}$ cm$^{-3}$=about 450 ohm-cm for n-type doping and about 1,320 ohm-cm for Boron doping (at 300 K). The semiconductor substrate may be an epitaxial article.

The semiconductor substrate which provides the bottom substrate portion can be doped p-type or n-type, such as a p+ (doping $\geq 5\times10^{19}$ cm$^{-3}$) or an n+ substrate (doping $\geq 5\times10^{19}$ cm$^{-3}$). The substrate can comprise silicon, silicon-germanium, or other silicon comprising substrate material. As noted above, the intrinsic layer can be an epitaxial layer, and the top silicon comprising layer can also be an epitaxial layer.

Figure 2A:
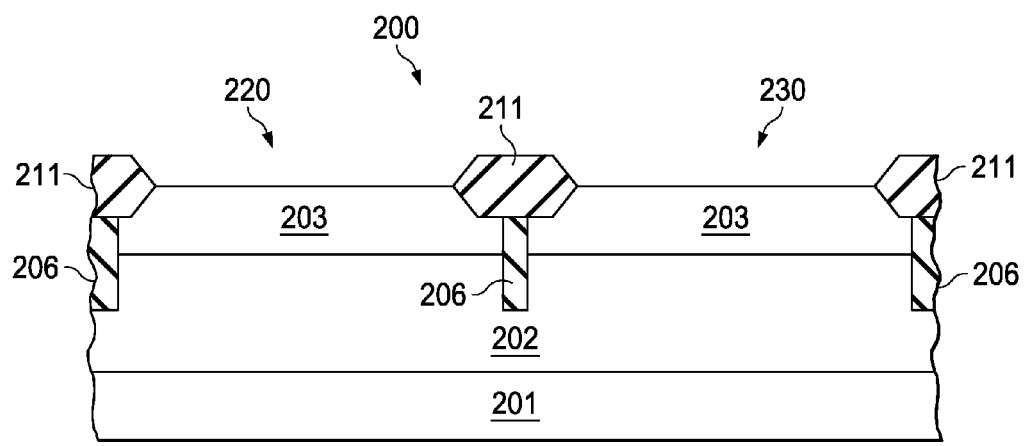
FIGS. 2A-D are cross-sectional diagrams showing processing progression for an example method for fabricating a PDA having first PDs in first diode areas having a first ARC stack and second PDs in second diode areas having a second ARC film stack which is different from the first ARC film stack, according to an example embodiment.

FIG. 2A is a cross-sectional diagram showing a semiconductor substrate 200 (e.g., a semiconductor wafer) having bottom substrate portion 201 doped with the first doping type, an intrinsic layer 202 thereon, and a top silicon comprising layer 203 doped with the second doping type (n-type in this example). The first doping type can be p-type and the second doping type can be n-type, or the first doping type can be n-type and the second doping type can be p-type.

Electrical isolation between the first diode area 220 and second diode area 230 is provided as shown by LOCOS region 211 (LOCal Oxidation of Silicon, is a microfabrication process where silicon dioxide is formed in selected areas on a silicon wafer having the Si—SiO$_2$ interface at a lower point than the rest of the silicon surface), on a junction isolation region 206 between the first and second diode areas. When using junction isolation region 206 as shown in FIGS. 2A-2D, 3A, 3B and 4, the intrinsic layer 202 will be of a dopant type that is opposite to that of the top silicon comprising layer 203 (and the same dopant type as the bottom substrate portion 201). For example, for the top silicon comprising layer 203 being n-type, the junction isolation region 206 will be p-type.

Although not shown, trench isolation may also be used to replace LOCOS region 211 and junction isolation region 206. In this case, the intrinsic layer 202 can be either dopant type.

Step 102 comprises forming a masking layer on the first diode areas. The masking layer can be a photoresist layer, or other layer such as a dielectric layer that can be easily selectively removed. The second diode areas are exposed by the pattern of the masking layer.

Step 103 comprises implanting a surface of the second diode areas 230 with the second doping type while the masking layer protects the first diode areas 220 from the implant to provide in the final PDA a dopant concentration at a surface of the top diode layer in the second diode areas that is at least three (3) times higher than the first surface doping concentration at a surface of the top diode layer in the first diode areas. The surface doping difference can be at least an order of magnitude higher in another embodiment.

The surface of the top diode layer in the first diode areas 220 may optionally include an implant to adjust (typically increase) the resulting thermal oxide thickness as compared the resulting thermal oxide thickness when the top diode layer in the first diode areas is not implanted. It is also possible to implant both the top diode layer in the first diode areas 220 and in the second diode areas 230 with a first implant, and use a selective second implant that implants the top diode layer in the second diode areas 230 but does not implant the top diode layer in the first diode areas 220.

Figure 2B:
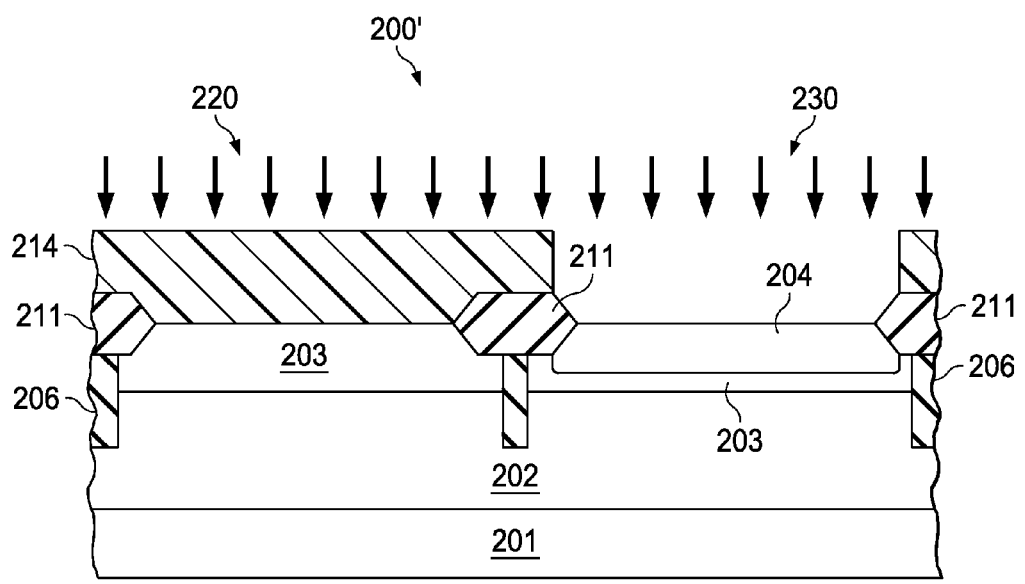

FIG. 2B is a cross-sectional diagram showing the semiconductor substrate 200' (e.g., a wafer) during step 103 implantation and the resulting implanted top silicon comprising layer 204 in the second diode areas 230 having a higher surface dopant concentration compared to the surface dopant concentration in the top silicon comprising layer 203 for the first diode areas 220, where the masking layer (e.g., resist pattern) 214 is over the first diode areas 220. Method 100 uses a higher doping concentration at a surface of the top silicon comprising layer 204 in the second diode areas 230 as compared to the doping concentration at a surface of the top silicon comprising layer 203 in the first diode areas 220 to form different thermal oxide layer thicknesses as described below.

The kinetics of thermal oxidation of silicon are understood in the art. The Deal-Grove (linear-parabolic) model describes physical and chemical processes occurring during the thermal oxidation of silicon, where the silicon oxide growth rate in the linear regime is limited by the speed of the interface reaction in the thin film regime when the silicon oxide film is generally less than about 500 angstroms. As a result, the oxidation rate in the linear regime is significantly affected by surface doping level and type since the dopant alters the free energy of the silicon interface, changing the rate of interfacial chemical reactions. Dopant type (n or p) affects the free energy in different ways, and both n-type and p-type doping can be used to increase the silicon oxide growth rate in the linear regime, which is sometimes referred to in the art as "the dopant effect.". The dependence of the silicon oxide growth rate on doping level and type. For phosphorous, as the concentration of phosphorus increases from $1\times10^{19}$ cm$^{-3}$ to $1\times10^{21}$ cm$^{-3}$, the silicon oxide growth rate in the linear regime can increase in excess of 1,000 percent.

Step 104 comprises thermally oxidizing the top silicon comprising layer to form a thermal silicon oxide layer which provides a bottom ARC layer, wherein the second diode areas 230 grow the thermal silicon oxide layer thicker as compared to the thermal silicon oxide layer in the first diode areas 220. The thermal silicon oxide layer disposed between the top ARC layer described below and the silicon comprising surface of the PDs can reduce the tension/stress between the Si comprising surface and the Si and top ARC layer (e.g., silicon nitride).

Figure 2C:
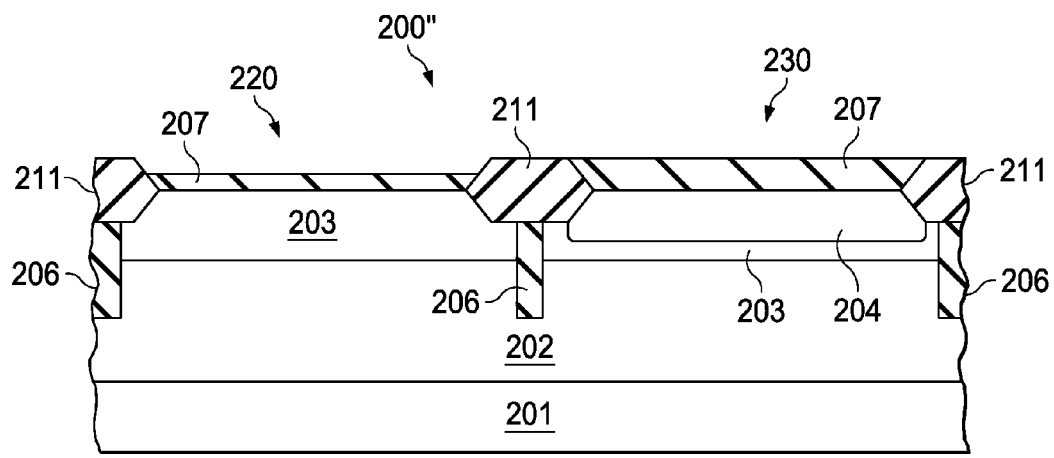

FIG. 2C is a cross-sectional diagram of the semiconductor substrate 200'' (e.g., a wafer) showing the thermal silicon oxide layer 207 results after the step 104 thermally oxidizing where the thermal silicon oxide layer 207 thicker over the second diode areas 230 results (which have a having a higher surface dopant concentration) as compared to the thickness of the thermal silicon oxide thickness layer 207 over the first diode areas 220.

Step 105 comprises depositing a top ARC layer having a refractive index ($n_f$) greater than thermal silicon oxide (nf about 1.46) on the bottom ARC layer. The second ARC layer can comprise silicon nitride ($n_f$ about 2.01), silicon oxynitride, or aluminum oxide ($n_f$ about 1.77). It is also possible to add additional ARC layer(s), such as a third ARC layer. After step 105, first PDs are provided in the first diode areas 220 and second PDs are provided in the second diode areas 230.

Figure 2D:
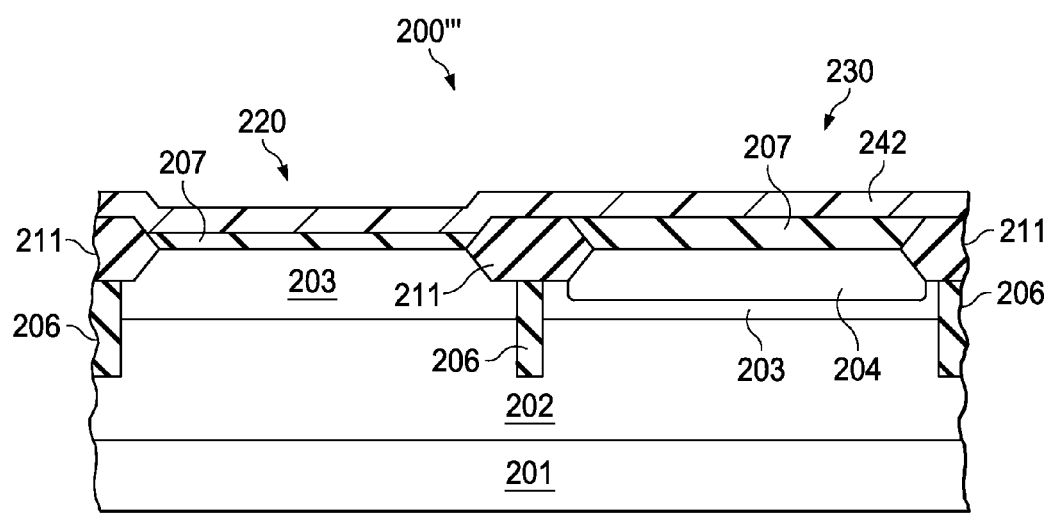

FIG. 2D is a cross-sectional diagram showing the semiconductor substrate 200''' after step 105. The top ARC layer 242 is then patterned, pre-metal dielectric deposited, followed by contact processing, metallization and a passivation overcoat to form the completed PDIC die 300 shown in FIG. 3, where first PDs 320 are provided in the first diode areas 220 shown in FIGS. 2A-D and second PDs 330 are provided in the second diode areas 230 shown in FIGS. 2A-D, where the first PDs and the second PDs have different photodiode structures.

Figure 3:
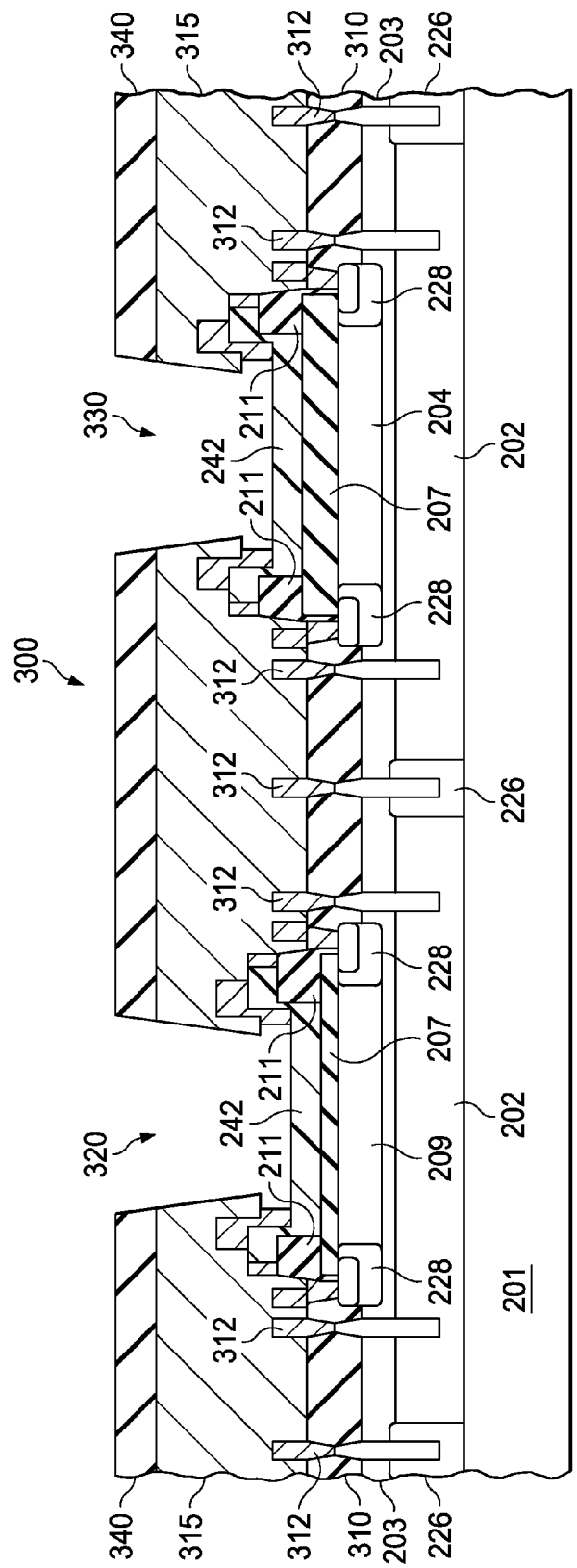
FIG. 3 is a cross sectional depiction of a disclosed PDA showing a portion thereof having first PDs in first diode areas having a first ARC stack and second PDs in second diode areas having a second ARC film stack which has a different ARC film stack, according to an example embodiment.

FIG. 3 is a cross sectional depiction of a disclosed PDA 300 showing a portion thereof. PDA 300 can be embodied as a PIN PDA or a NIP PDA, respectively. Generally, PDA 300 will be in a two dimensional array of PDs in a plurality of rows and columns, and each PD when embodied as a PD integrated circuit (PDIC) will be coupled to an amplifier on the chip, and the PDIC will generally also include readout circuitry. PDA 300 includes a semiconductor substrate having a bottom substrate portion 201 doped with a first doping type, an intrinsic layer 202 on the bottom substrate portion, and a top silicon comprising layer 203 doped with a second doping type on the intrinsic layer 202. As noted above, there is a first PDA 320 corresponding to the first diode areas 220 shown in FIGS. 2A-2D, and a second PDA 330 corresponding to the second diode areas 230 shown in FIGS. 2A-2D, with the bottom substrate portion 201 providing a bottom diode layer and the top silicon comprising layer 203 providing a top diode layer.

The doping at the semiconductor surface of the first PDA 320 is shown as region 209 which includes an optional implant to provide doping beyond that of top silicon comprising layer 203 in the first diode areas. The doping at the semiconductor surface of the second PDAs 330 is shown as top silicon comprising layer 204 which includes an implant described above, designed to provide a higher doping concentration at the top silicon comprising surface as compared to the doping concentration at the top silicon comprising surface of the first PDA 320, which is at least three times higher (e.g., an order of magnitude higher).

The thermal silicon oxide layer 207 is on a surface of the top silicon comprising layers 204 for PDA 330 and for top silicon comprising layers 209 for PDA 320. Thermal silicon oxide layer 207 provides a bottom ARC layer for PDA 320 and second PDA 330, respectively. The thermal silicon oxide layer 207 is thicker for the second PDA 330 as compared to the thermal silicon oxide layer 207 for the first PDA 320. In one embodiment, the thermal silicon oxide layer 207 in the second PDA 330 is 100 to 240 A thick and the thermal silicon oxide layer 207 in the first PDA 320 is 20 to 95 A thick.

Thermal silicon oxide is known in the art to be physically distinct from other silicon oxides formed by other methods, such as chemical vapor deposition (CVD) and its variants. These distinctions include thermal silicon oxide having (1) a nearly electrically perfect interface between silicon and silicon oxide; (2) higher dielectric strength of the thermal silicon oxide; and (3) excellent control of the thickness uniformity of the silicon oxide film. For example, regarding dielectric strength, thermal silicon oxides can provide dielectric strength of $>1\times10^7$ V/cm; while CVD silicon oxides have a lower dielectric strength typically being $1\times10^6$ V/cm to $3\times10^6$ V/cm.

The top ARC layer 242 has a refractive index greater than thermal silicon oxide and is on the thermal silicon oxide layer 207/bottom ARC layer. PDA 300 is shown including a sinker diffusion 226 for providing a low resistance connection from the top side of the PDA 300 to the bottom substrate portion 201, and contact regions 228 allowing low resistance contacts to regions 209 and 204 which provides the top diode layer for first PDA 320 and second PDA 330, respectively. PDA 300 includes a pre-metal dielectric layer 310, filled contacts 312 through the pre-metal dielectric (PMD) layer 310, a multilayer metal stack 315 on the PMD layer 310, and a passivation overcoat layer 340 on the multilayer metal stack 315. There are apertures in the multilayer metal stack 315 and passivation overcoat layer 340 to provide exposed ARC surfaces to the ambient (except at their periphery) for receiving incident radiation (light) at the respective PDAs 320 and 330.

Figure 4:
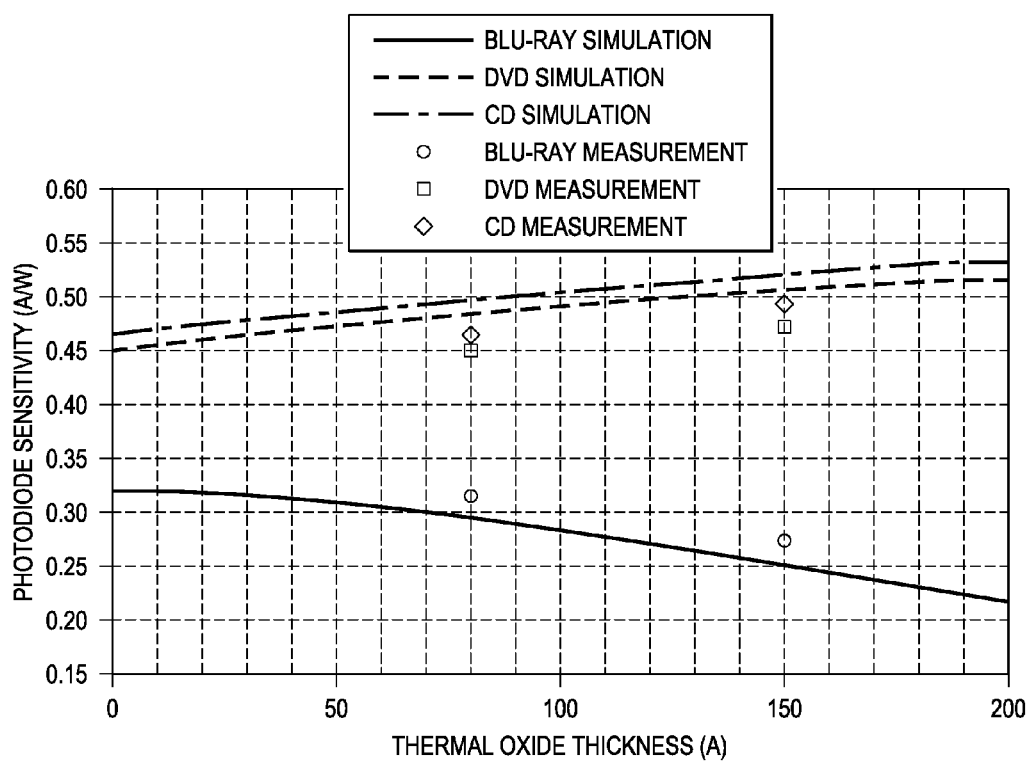
FIG. 4 provides experimental and simulated PD sensitivity results as a function of thermal oxide thickness in graphical form from an example PDA based on the PDs described relative to FIG. 3.

FIG. 4 provides experimental and simulated PD sensitivity results as a function of thermal oxide thickness in graphical form from an example PDA based on the PDs described relative to FIG. 3. The top ARC layer was silicon nitride about 520 A thick for all PDs. All PDs were PIN PDs. Both the first PDs in the first diode areas and second PDs in the second diode areas both received n-type ion implants, with their n-type implants being different. First PDs 320 received phosphorous at 70 keV at a dose of $5.0\times10^{13}$ cm$^{-2}$ with the resulting thermal oxide thickness 207 being about 80 A, and the second PDs received arsenic at 80 keV at a dose of $5.0\times10^{14}$ cm$^{-2}$ with the resulting thickness of the thermal silicon oxide layer 207 being about 150 A.

From the data provided, it can be seen using a conventional single thermal oxide thickness, such as at the 80 A and 150 A values shown on the experimental data, PD sensitivity is traded off between the Blu-ray PDs and CD and DVD PDs. At 80 A, the PD sensitivity for Blu-ray is 0.314 A/W, for DVD 0.448 A/W CD 0.471 A/W. At 150 A, the PD sensitivity for Blu-ray is 0.272 A/W (reduced relative to 80 A), for DVD 0.471 A/W (increased relative to 80 A), and for CD 0.492 A/W (increased relative to 80 A). As disclosed above, by selective implantation, disclosed PDAs can provide thinner thermal oxide (e.g., 80 A) for some PDs, such as Blu-ray PDs, and a thicker thermal oxide (e.g., 150 A) for other PDs (for DVD and CD). As a result, in one example disclosed PDs can provide relatively high sensitivity for Blu-ray, DVD and CD PDs by providing 80 A thermal oxide for Blu-ray PDs to provide a PD sensitivity for Blu-ray of 0.314 A/W, while proving 150 A thermal oxide for DVD and CD PDs to provide a PD sensitivity of 0.471 A/W and 0.492 A/W respectively.

Disclosed embodiments can be used to form semiconductor die that may integrated into a variety of assembly flows to form a variety of different devices and related products. The semiconductor die may include various elements therein and/or layers thereon, including barrier layers, dielectric layers, device structures, active elements and passive elements including source regions, drain regions, bit lines, bases, emitters, collectors, conductive lines, conductive vias, etc. Moreover, the semiconductor die can be formed from a variety of processes including bipolar, CMOS, BiCMOS and MEMS.

Those skilled in the art to which this disclosure relates will appreciate that many other embodiments and variations of embodiments are possible within the scope of the claimed invention, and further additions, deletions, substitutions and modifications may be made to the described embodiments without departing from the scope of this disclosure.

The invention claimed is:

1. A photodetector array (PDA), comprising:
    a semiconductor substrate including first diode areas and second diode areas having a bottom substrate portion doped with a first doping type, an intrinsic layer on said bottom substrate portion, and a top silicon comprising layer doped with a second doping type on said intrinsic layer, said bottom substrate portion providing a bottom diode layer and said top silicon comprising layer providing a top diode layer,
    wherein a second surface dopant concentration in a surface of said second diode areas that is at least three times higher than a first surface dopant concentration in a surface of said first diode areas;

a thermal silicon oxide layer on said top silicon comprising layer which provides a bottom Anti-Reflective Coating (ARC) layer for said first and second diode areas, wherein said second diode areas have said thermal silicon oxide layer thicker as compared to said thermal silicon oxide layer on said first diode areas, and a top ARC layer having a refractive index greater than said thermal silicon oxide layer on said bottom ARC layer, wherein first PDs are provided in said first diode areas and second PDs are provided in said second diode areas.

2. The PDA of claim 1, wherein said top ARC layer comprises silicon nitride.

3. The PDA of claim 1, wherein said second surface dopant concentration is at least an order of magnitude higher than said first surface dopant concentration.

4. The PDA of claim 1, wherein said first doping type is n-type and said second doping type is p-type.

5. The PDA of claim 1, wherein said first doping type is p-type and said second doping type is n-type.

6. The PDA of claim 1, wherein said thermal silicon oxide layer in said second diode areas is 100 to 240 A thick and said thermal silicon oxide layer in said second diode areas is 20 to 95 A thick.

7. The PDA of claim 1, wherein said surface of said second diode areas included an implanted surface region of said second doping type.

8. The PDA of claim 2, wherein said semiconductor substrate comprises silicon or silicon germanium.

9. A method of fabricating a photodiode array (PDA), comprising:

providing a semiconductor substrate including first diode areas and second diode areas having a bottom substrate portion doped with a first doping type, an intrinsic layer on said substrate portion, and a top silicon comprising layer doped with a second doping type on said intrinsic layer, said bottom substrate portion providing a bottom diode layer and said top silicon comprising layer providing a top diode layer, forming a masking layer on said first diode areas;

implanting said second diode areas with said second doping type while said masking layer protects said first diode areas to provide a second surface dopant concentration in a surface of said second diode areas that is at least three times higher than a first surface dopant concentration in a surface of said first diode areas;

thermally oxidizing said top silicon comprising layer to form a thermal silicon oxide layer to provide a bottom Anti-Reflective Coating (ARC) layer, wherein said second diode areas grow said thermal silicon oxide layer thicker as compared to said thermal silicon oxide layer on said first diode areas, and depositing a top ARC layer having a refractive index greater than said thermal silicon oxide layer on said bottom ARC layer, wherein first PDs are provided in said first diode areas and second PDs are provided in said second diode areas.

10. The method of claim 9, wherein said top ARC layer comprises silicon nitride.

11. The method of claim 9, wherein said second surface dopant concentration is at least an order of magnitude higher than said first surface dopant concentration.

12. The method of claim 9, wherein said first doping type is n-type and said second doping type is p-type.

13. The method of claim 9, wherein said first doping type is p-type and said second doping type is n-type.

14. The method of claim 9, wherein said thermal silicon oxide layer in said second diode areas is 100 to 240 A thick and said thermal silicon oxide layer in said second diode areas is 20 to 95 A thick.

15. The method of claim 9, wherein said thermally oxidizing comprises a steam oxidation.

16. The method of claim 9, further comprising implanting said surface of said second diode areas with said second doping type.

* * * * *